US012665171B2

(12) United States Patent (10) Patent No.: US 12,665,171 B2
Susa et al. (45) Date of Patent: Jun. 23, 2026

(54) METHOD AND SYSTEM FOR SELECTIVELY REMOVING MATERIAL AT AN EDGE OF A SUBSTRATE

(71) Applicant: ASM IP Holding B.V., Almere (NL)

(72) Inventors: Yoshio Susa, Tama (JP); Koei Aida, Hachioji (JP); Ryo Miyama, Tokyo (JP); Yoshiyuki Kikuchi, Tokyo (JP)

(73) Assignee: ASM IP Holding B.V., Almere (NL)

( * ) Notice: Subject to any disclaimer, the term of this patent is extended or adjusted under 35 U.S.C. 154(b) by 629 days.

(21) Appl. No.: 17/973,903

(22) Filed: Oct. 26, 2022

(65) Prior Publication Data

US 2023/0137026 A1 May 4, 2023

Related U.S. Application Data

(60) Provisional application No. 63/273,707, filed on Oct. 29, 2021.

(51) Int. Cl.
| | | |
|---|---|---|
| *H01J 37/32* | (2006.01) | |
| *H10P 14/60* | (2026.01) | |
| *H10P 50/28* | (2026.01) | |
| *H10P 72/72* | (2026.01) | |

(52) U.S. Cl.
CPC ...... *H01J 37/3244* (2013.01); *H10P 14/6336* (2026.01); *H10P 50/283* (2026.01); *H10P 72/72* (2026.01)

(58) Field of Classification Search
CPC ............ H01J 37/3244; H01J 37/32449; H01J 37/32715; H01J 37/32385; H01L 21/02274; H01L 21/31116; H01L 21/6831; H01L 21/02087; H01L 21/02115; H01L 21/31122; H01L 21/31138; H01L 21/67103; H01L 21/68785; C23C 16/04; C23C 16/45565; C23C 16/4583; C23C 16/505
USPC ........................................................ 216/67
See application file for complete search history.

(56) References Cited

U.S. PATENT DOCUMENTS

| | | | | |
|---|---|---|---|---|
| 6,217,786 B1 * | 4/2001 | Hills | ................. | H01L 21/31116 |
| | | | | 257/E21.252 |
| 7,858,898 B2 | 12/2010 | Bailey, III | | |
| 7,967,996 B2 * | 6/2011 | Collins | ............... | H01L 21/0209 |
| | | | | 438/731 |
| 11,462,387 B2 | 10/2022 | Mori | | |
| 11,488,819 B2 | 11/2022 | Lee et al. | | |
| 12,531,210 B2 | 1/2026 | Chandrashekar et al. | | |
| 2011/0024399 A1 * | 2/2011 | Kim | .................. | H01L 21/67751 |
| | | | | 219/121.41 |
| 2016/0064215 A1 | 3/2016 | Sexton et al. | | |
| 2019/0311940 A1 | 10/2019 | Choi et al. | | |
| 2020/0181798 A1 * | 6/2020 | Mabuchi | ................. | C30B 25/12 |
| 2021/0166910 A1 | 6/2021 | Kim | | |

FOREIGN PATENT DOCUMENTS

| | | | | | |
|---|---|---|---|---|---|
| KR | 100558925 B1 | * | 3/2006 | ........ | H01J 37/32385 |
| KR | 100777467 B1 | * | 11/2007 | ....... | H01L 21/67069 |
| KR | 20090106728 A | | 10/2009 | | |

* cited by examiner

*Primary Examiner* — Duy Vu N Deo

(74) *Attorney, Agent, or Firm* — Snell & Wilmer L.L.P.

(57) ABSTRACT

Methods and apparatuses for etching a perimeter of a substrate are disclosed. Exemplary methods and apparatuses can be used to deposit material and selectively etch material at the perimeter of the substrate within the same reaction chamber.

14 Claims, 7 Drawing Sheets

METHOD AND SYSTEM FOR SELECTIVELY REMOVING MATERIAL AT AN EDGE OF A SUBSTRATE

CROSS-REFERENCE TO RELATED APPLICATIONS

This application claims priority to U.S. Provisional Patent Application Ser. No. 63/273,707 filed Oct. 29, 2021 titled METHOD AND SYSTEM FOR SELECTIVELY REMOVING MATERIAL AT AN EDGE OF A SUBSTRATE, the disclosure of which is hereby incorporated by reference in its entirety.

FIELD OF INVENTION

The present disclosure generally relates to improved apparatuses and methods for depositing a film and for removing material at an edge of a substrate.

BACKGROUND OF THE DISCLOSURE

Gas-phase reactors, such as chemical vapor deposition (CVD), plasma-enhanced CVD (PECVD), atomic layer deposition (ALD), and the like can be used for a variety of applications, including cleaning, depositing and etching materials on a substrate surface. For example, gas-phase reactors can be used to clean, deposit and/or etch layers on a substrate to form semiconductor devices, flat panel display devices, photovoltaic devices, microelectromechanical systems (MEMS), and the like.

After deposition of films using ALD and CVD processes, delamination of the film can occur at an edge or the side of the substrate. The delamination may deleteriously affect subsequent substrate processing and even prevent the substrate from proceeding to the next process—e.g., a lithography process. One resolution to this issue is the use of a bevel etcher to remove the film on the bevel (or edge) of the substrate. In this process, the substrate may be picked up from the deposition process chamber and placed into a different process chamber in which the film at the bevel of the substrate is removed. The removal is facilitated by a confined plasma at the edge of the substrate. However, this process requires the use of two process chambers, reducing throughput, and increasing the time and expense needed to perform the process.

Therefore, improved apparatuses and methods that improve the efficiency and reduce the footprint of these processes are desired.

Any discussion of problems and solutions set forth in this section has been included in this disclosure solely for the purposes of providing a context for the present disclosure, and should not be taken as an admission that any or all of the discussion was known at the time the invention was made.

SUMMARY OF THE DISCLOSURE

Exemplary embodiments of this disclosure provide an apparatus and method for selectively etching a bevel/edge of a substrate relative to a center of the substrate. While the ways in which various embodiments of the present disclosure address drawbacks of prior apparatuses and methods are discussed in more detail below, in general, various embodiments of the disclosure provide methods and substrate processing apparatuses for providing an etch gas and generating a plasma at the perimeter of a substrate.

In various embodiments of the disclosure, a method of selectively removing a film at the edge of a substrate comprises providing a substrate processing apparatus comprising a susceptor, a gas distribution device, and a flow control ring above the susceptor; providing the substrate on the susceptor; providing a gas distribution device, providing an etch gas below a bottom surface of the substrate; and forming a plasma using the gas distribution device and the susceptor. The gas distribution device may be positioned above the susceptor. The gas distribution device and susceptor may be configured to form a plasma at the perimeter of the substrate. In various embodiments, the etch gas does not remove the film at the center of the substrate to an appreciable extent. In various embodiments, the susceptor comprises an etch gas channel configured to provide the etch gas from below the bottom surface of the substrate toward the top surface of the susceptor and about a perimeter of the substrate.

In various embodiments, the plasma is formed between an inner surface of the flow control ring and the perimeter of the susceptor.

In various embodiments, the method further comprises modifying a flow rate of the etch gas. The etch gas may comprise, for example, at least one of $H_2$, $O_2$, $CO_2$, $NO_2$, $NH_3$, He, Ar, $N_2$, and CO and mixtures thereof. In some embodiments, the etch gas comprises $H_2$ and one of Ar and He.

In various embodiments, the susceptor comprises an electrostatic chuck.

In various embodiments, the method further comprises providing a deposition gas through the gas distribution device while the etch gas is provided. In various embodiments, the deposition gas is provided before the etch gas is provided. In various embodiments, the method comprises providing an inert gas through the gas distribution device while the etch gas is provided.

In various embodiments, a substrate processing apparatus comprises a susceptor configured to support a substrate and a gas distribution device above the substrate, wherein the susceptor comprises a channel configured to provide an etch gas from below a bottom of the substrate, and wherein the gas distribution device and the susceptor are configured to form a plasma at a perimeter of the substrate. In various embodiments, the channel extends to the bottom of the susceptor. In various embodiments, the channel is configured to provide the etch gas from below the substrate toward a top surface of the substrate and about the perimeter of the substrate.

In various embodiments, the substrate processing apparatus further comprises a flow control ring above the susceptor. In various embodiments, the susceptor comprises an electrostatic chuck. In various embodiments, the susceptor comprises a heater.

In various embodiments, a reactor system comprises the substrate processing apparatus of any of the embodiments described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 7:
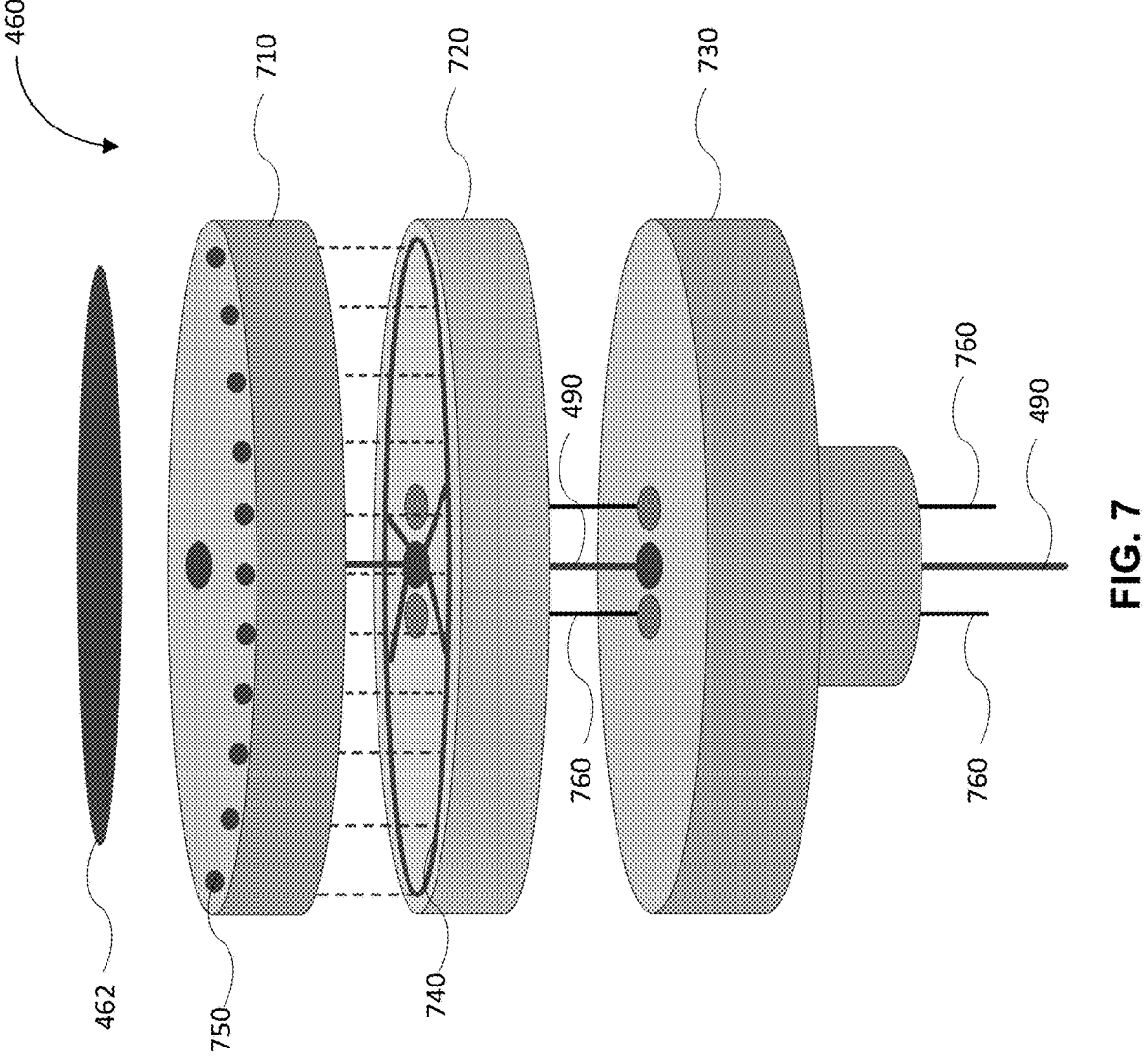

FIG. 7 illustrates an exploded view of an exemplary electrostatic chuck electrode It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses described herein and obvious modifications and equivalents thereof. Thus, it is intended that the scope of the invention disclosed should not be limited by the particular disclosed embodiments described below.

As used herein, the terms "substrate" may refer to a wafer or any underlying material or materials that may be used to form, or upon which, a device, a circuit, or a film may be formed. Further, the substrate can include various features, such as recesses, lines, and the like formed within or on at least a portion of a layer of the substrate.

In some embodiments, the terms "film" and "layer" may be used interchangeably and refer to a layer extending in a direction perpendicular to a thickness direction to cover an entire target or concerned surface, or simply a layer covering a target or concerned surface. In some embodiments, the terms "film" or "layer" refer to a structure having a certain thickness formed on a surface. A film or layer may be constituted by a discrete single film or layer having certain characteristics. Alternatively, a film or layer may be constituted of multiple films or layers, and a boundary between adjacent films or layers may or may not be clear and may or may not be established based on physical, chemical, and/or any other characteristics, formation processes or sequence, and/or functions or purposes of the adjacent films or layers.

In some embodiments, "gas" can include material that is a gas at normal temperature and pressure, a vaporized solid and/or a vaporized liquid, and may be constituted by a single gas or a mixture of gases, depending on the context. A gas can include a process gas, an etch gas or other gas that passes through the substrate processing device, such as through a susceptor, a shower plate, a gas distribution device, a gas supply apparatus, an electrode, or the like. A process gas may include a reactant or precursor that takes part in a reaction within a reaction chamber and/or include ambient gas, such as air. An etch gas may include a gas that can etch a portion of a substrate.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments. Percentages set forth herein are absolute percentages, unless otherwise noted.

It shall be understood that the term "comprising" is open ended and does not exclude the presence of other elements or components, unless the context clearly indicates otherwise. The term "comprising" includes the meaning of "consisting of." The term "consisting of" indicates that no other features or components are present than those mentioned, unless the context indicates otherwise.

Figure 1:
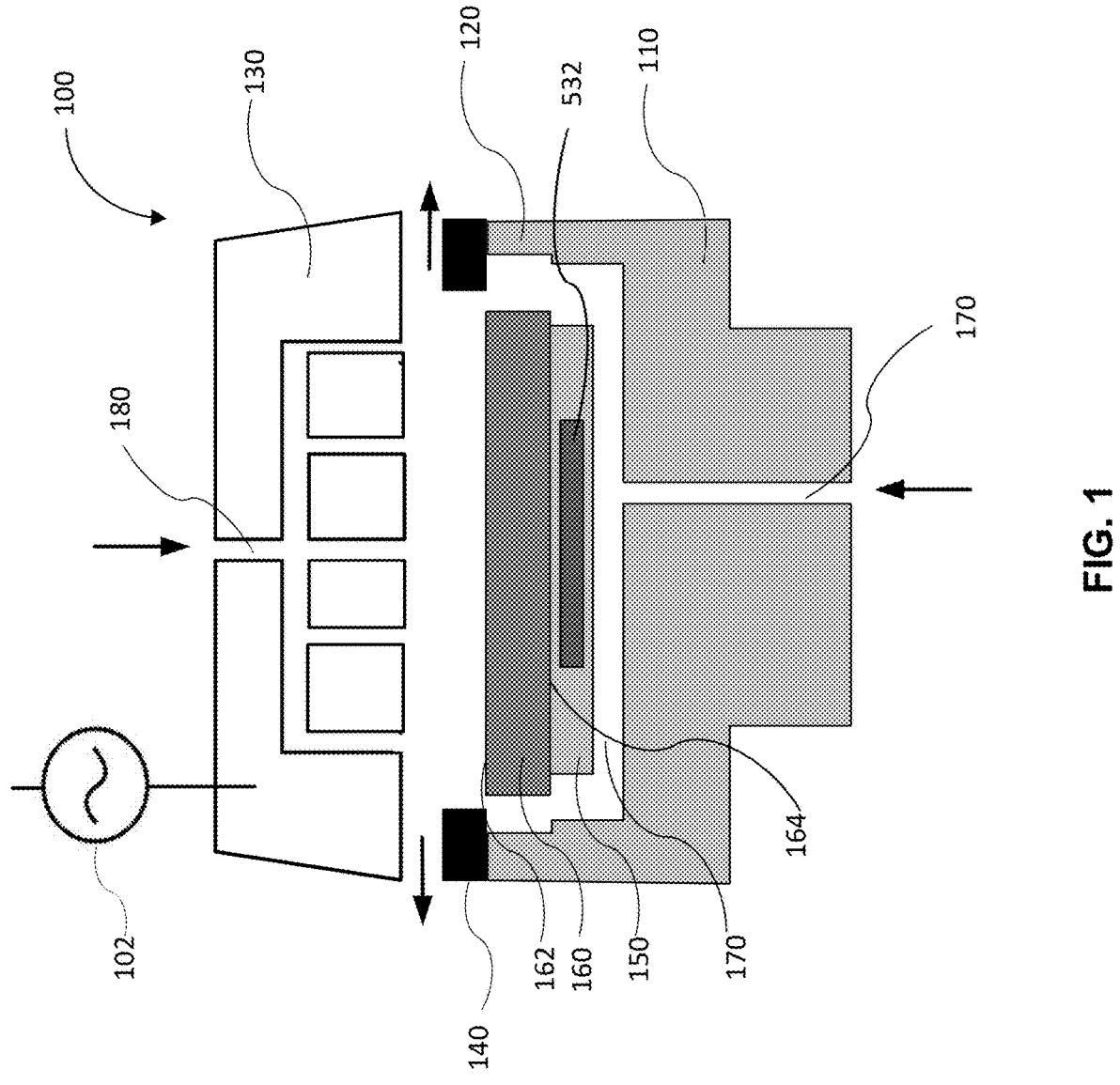
FIG. 1 illustrates a substrate processing apparatus in accordance with at least one embodiment of the disclosure.

Turning to the figures, FIG. 1 illustrates a substrate processing apparatus 100 according to an embodiment of the disclosure. Substrate processing apparatus 100 includes a gas distribution device 130, a deposition gas feed 180, a susceptor 110, an etch gas channel 170, a substrate stage 150, and a flow control ring 140. FIG. 1 depicts a substrate 160 having a top surface 162 and a bottom surface 164; substrate 160 is disposed on the substrate stage 150. In some embodiments, gas distribution device 130 forms an electrode, and plasma is activated by (e.g., RF) power source 102. Arrows indicate the direction of gas flow through substrate processing apparatus 100. A gas provided through deposition gas feed 180 may be a process gas such as a gas including one or more precursors and/or reactants for depositing a film on substrate 160. The deposition gas feed 180 may also provide an inert (e.g., noble) gas or purge gas. A gas provided through etch gas channel 170 may provide an etch gas to substrate 160. Due to the position and configuration of etch gas channel 170 below substrate stage 150, the etch gas is directed to the edge of substrate 160. In some embodiments, flow control ring 140 also further guides the direction of etch gas to the edge of substrate 160 and out of substrate processing apparatus 100. In some embodiments, susceptor 110 further includes a heater 532 configured to heat the susceptor 110.

Figure 2:
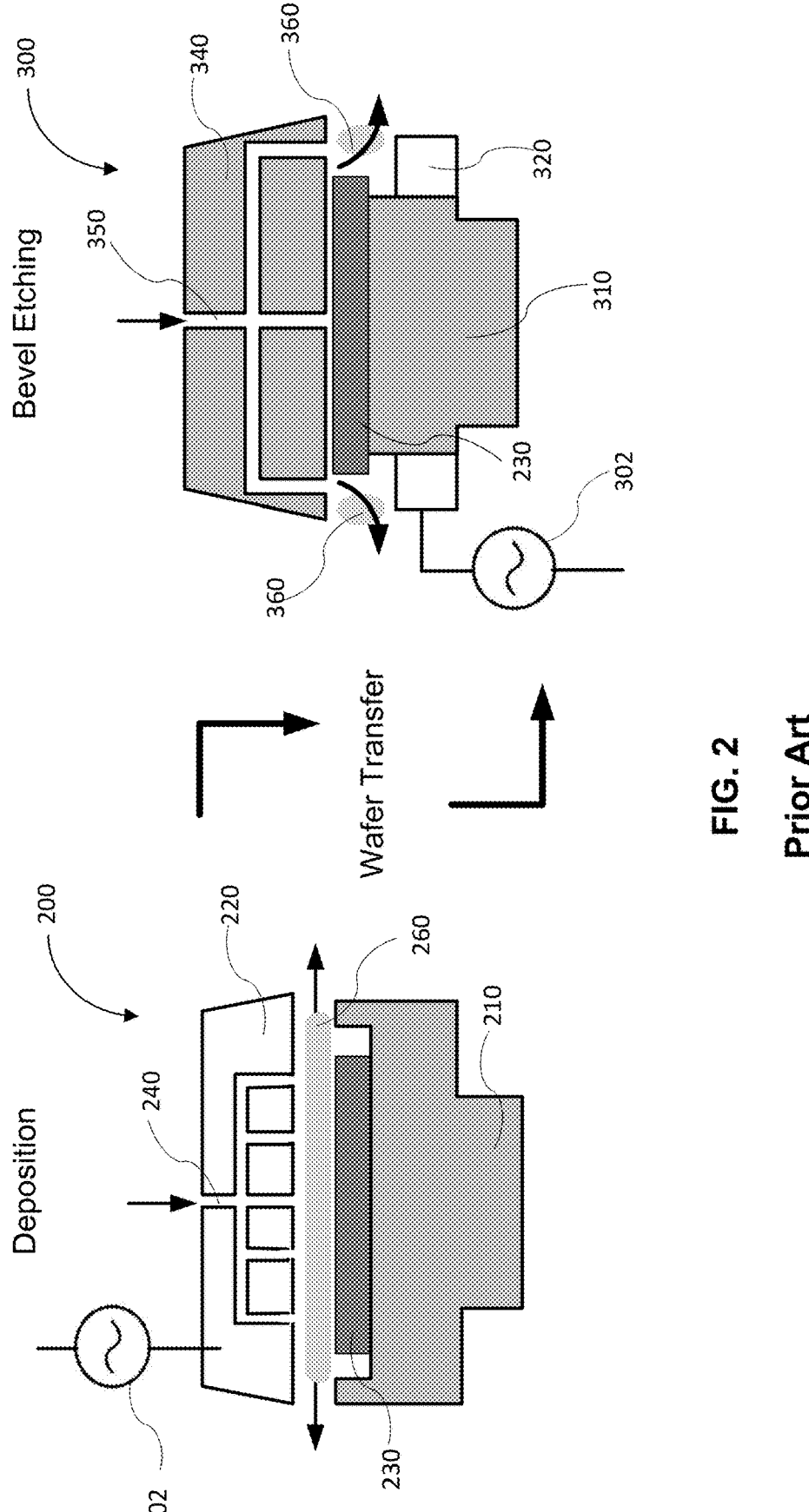
FIG. 2 illustrates a film deposition and etching process in accordance with previously known devices.

FIG. 2 illustrates a process of depositing a film and etching the substrate at the edge of the film using previous methods and apparatuses. In these processes, an apparatus similar to carbon deposition apparatus 200 is used to deposit a film onto a substrate 230. Carbon deposition apparatus 200 includes a plasma gas distribution device 220 and power source 202 above a substrate 230, and a susceptor 210. In carbon deposition apparatus 200, a process gas is supplied to substrate 230 through deposition gas feed 240. Plasma activation forms a deposition plasma 260 that covers the substrate 230 and exits the carbon deposition apparatus 200. If the resulting film on substrate 230 requires etching at edge of the substrate 230, the substrate 230 must be transferred to an apparatus similar to carbon bevel etching apparatus 300, which is configured specifically for etching the edge of the substrate 230. Carbon bevel etching apparatus 300 includes a susceptor 310, a plasma electrode 320 and power source 302 below substrate 230, and a gas supply apparatus 340 above substrate 230 through which etch gas is supplied to substrate 230. An etch gas feed 350 is configured to direct gas flow to the edge of substrate 230. Plasma electrode 320 is positioned below substrate 230 at the edge of susceptor 310 in order to generate an etching plasma 360 only at the edge of substrate 230.

Figures 3A, 3B:
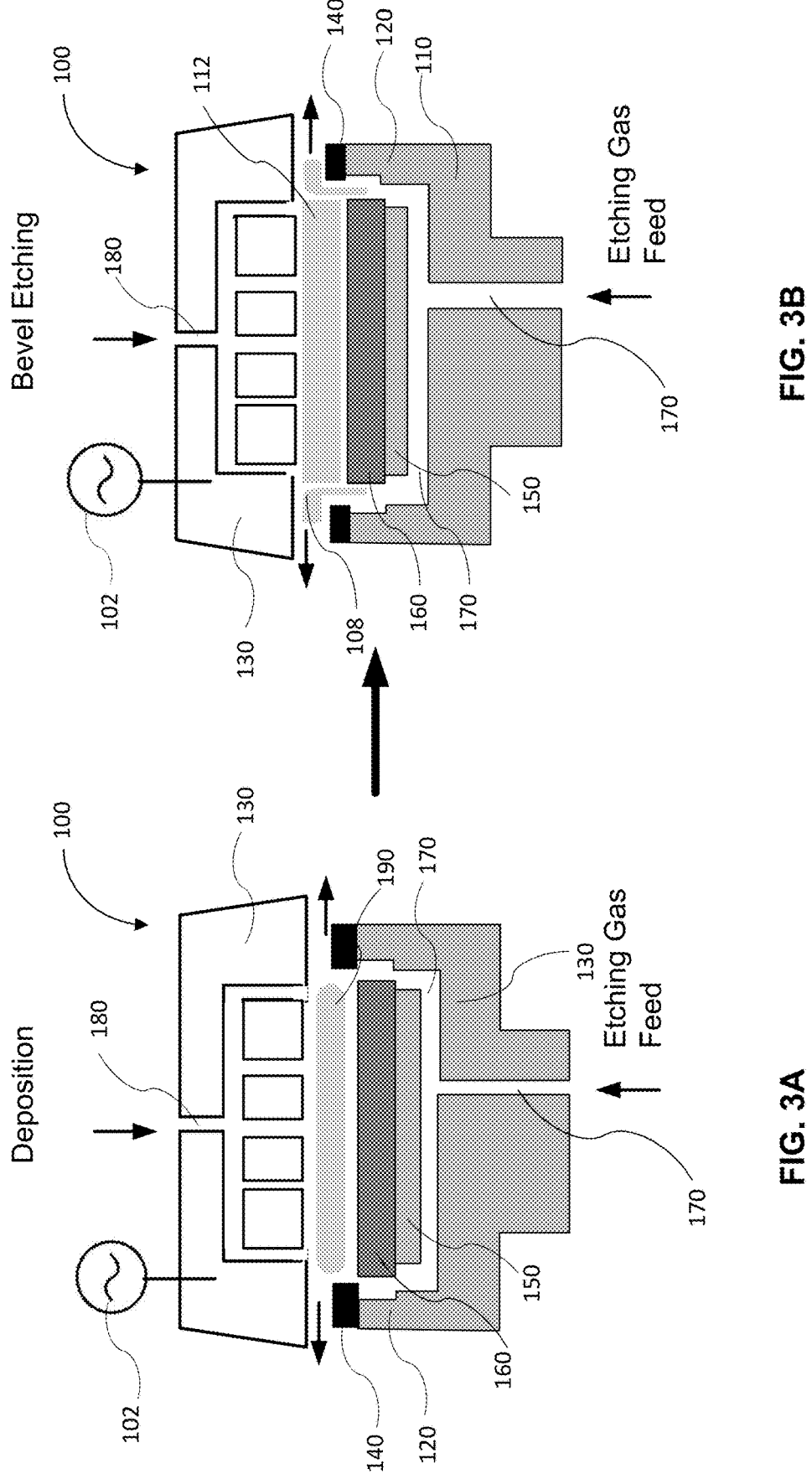
FIGS. 3A and 3B illustrates a film deposition and etching process in accordance with at least one embodiment of the disclosure.

In contrast, a process of depositing a film and etching the substrate at the edge of the film according to embodiments described herein is illustrated at FIG. 3. As shown in FIGS. 1 and 3, substrate processing apparatus 100 may be configured to provide etch gas through etch gas channel 170 below substrate 160, and to a generate deposition plasma 190 from gas distribution device 130 above substrate 160. FIG. 3A illustrates formation of a deposition plasma 190 in the substrate processing apparatus 100. In some embodiments, the deposition plasma 190 is activated by RF (e.g., 13.56 MHz) power by CCP type power source 102. FIG. 3B illustrates formation of an etching plasma 108 within the same substrate processing apparatus 100. Due to the position of etch gas channel 170 and flow control ring 140, generation of etching plasma 108 by electrode 130 may be focused at the edge of substrate 160, while a gas mixture forms a diluted plasma 112 at the center of substrate 160, which does not etch the film or material on substrate 160. The configuration of substrate processing apparatus 100 eliminates the need to transfer the substrate 160 to a separate apparatus for etching, thereby reducing the need for multiple tools to achieve the deposition and etching processes.

Figure 4:
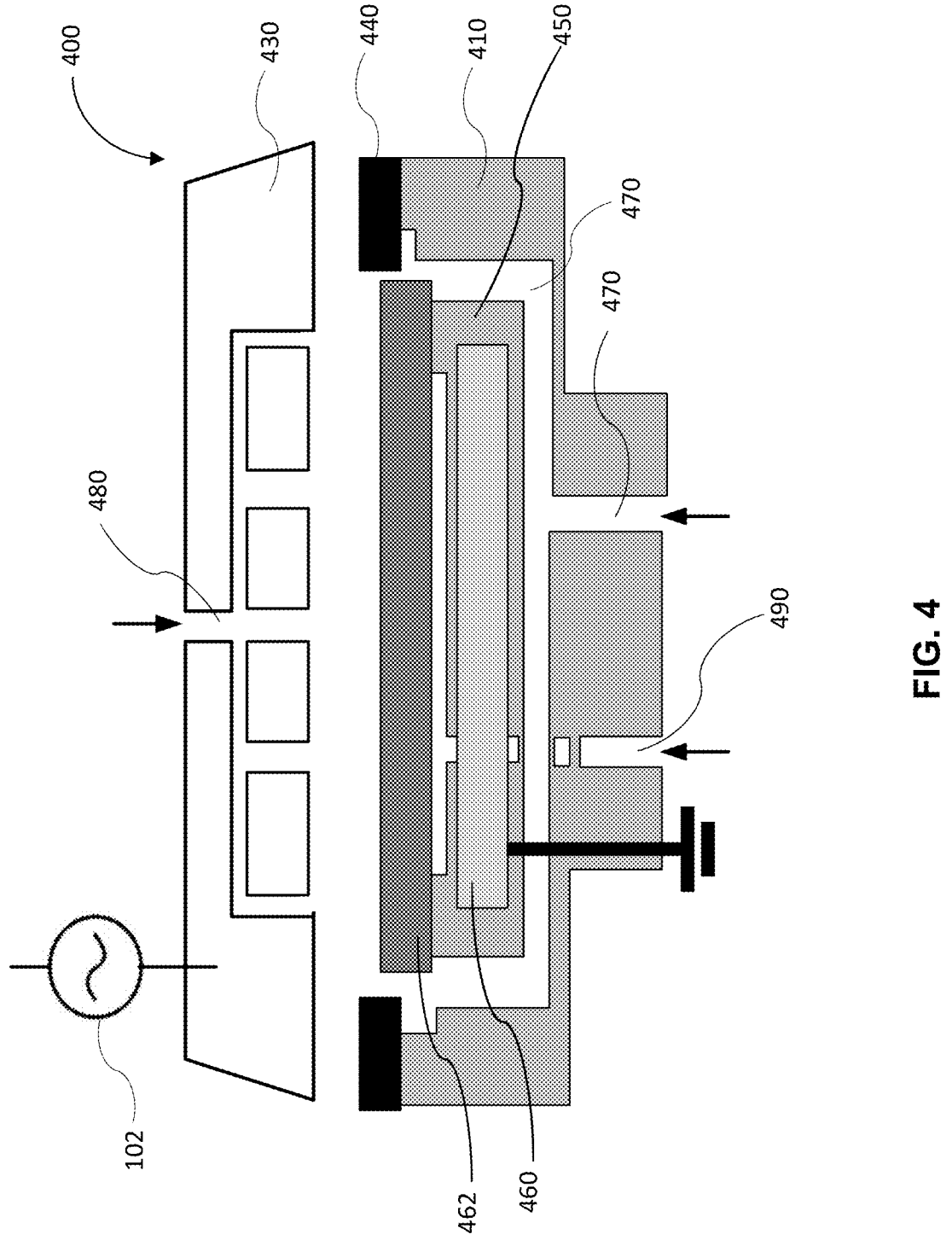
FIG. 4 illustrates a substrate processing apparatus in accordance with at least one embodiment of the disclosure.

FIG. 4 illustrates a substrate processing apparatus 400 according to another embodiment of the disclosure. Substrate processing apparatus 400 includes a gas distribution device 430, a deposition gas feed 480, a susceptor 410, an etch gas channel 470, a substrate stage 450, and a flow control ring 440. In some embodiments, susceptor 410 is configured as an electrostatic chuck, including an electrostatic chuck electrode 460 embedded within susceptor 410, and a gas is provided to a bottom surface of substrate 462 through center gas feed 490. In some embodiments, the gas provided through center gas feed 490 is a temperature control gas (e.g. helium). FIG. 7 illustrates an exploded view of an exemplary electrostatic chuck electrode 460, including a top plate 710, an insulator 720, and a bottom plate 730. In some embodiments, insulator 720 includes a ceramic material, and top plate 710 and bottom plate 730 include a metal material. In the illustrated embodiment, gas provided through center gas feed 490 is distributed to a channel 740 in insulator 720. From channel 740, gas is then distributed through gas holes 750 in top plate 710 to reach the perimeter of substrate 462. In FIG. 7, gas holes 750 are depicted in a portion of top plate 710 for simplicity. Gas holes 750 may be distributed around the entire circumference of top plate 710. The electrostatic chuck electrode 460 is powered by direct current lines 760.

Figure 5:
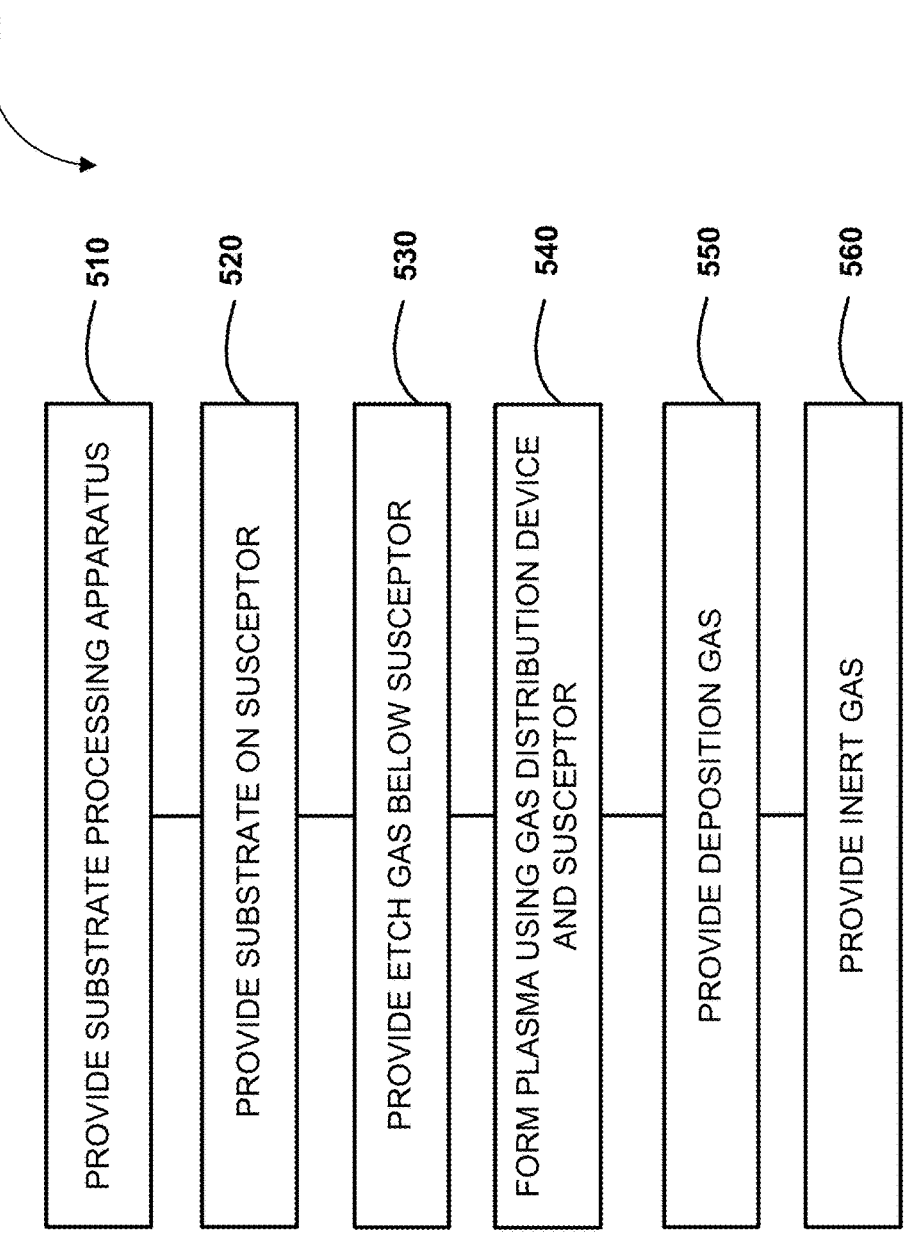
FIG. 5 illustrates a method in accordance with at least one embodiment of the disclosure.

FIG. 5 illustrates a method 500 for selectively removing a film at the edge of a substrate according to embodiments of the disclosure. Method 500 can be performed using process sequence 600. Method 500 includes the steps of providing a substrate processing apparatus (510), providing a substrate on the susceptor (520), providing an etch gas (530) below the susceptor, and forming a plasma using the gas distribution device and the susceptor (540). In some embodiments, the etch gas comprises at least one of a hydrogen-containing gas, an oxidant, a nitrogen-containing gas, a nitrogen and oxygen-containing gas, a nitrogen and hydrogen-containing gas, a noble gas, or mixtures thereof. By way of examples, the etch gas can include one or more of $H_2$, $O_2$, $CO_2$, $NO_2$, $NH_3$, He, Ar, $N_2$, and CO in any combination. In some embodiments, the etch gas comprises Ar and $H_2$. In some embodiments, the etch gas comprises He and $H_2$.

The steps of method 500 may be performed using substrate processing apparatus 100 or 400 in accordance with embodiments of the disclosure. In some embodiments, the gas distribution device is above the susceptor. In some embodiments, the gas distribution device and susceptor are configured to form a plasma at a perimeter of the substrate. In some embodiments, the substrate processing apparatus comprises a flow control ring above the susceptor. In some embodiments, the plasma is formed between an inner surface of the flow control ring and the perimeter of the susceptor. In preferred embodiments, the etch gas does not remove the film at the center of the substrate—to an appreciable extent. In preferred embodiments, the susceptor comprises an etch gas channel configured to provide the etch gas from below the bottom surface of the substrate toward the top surface of the susceptor and about a perimeter of the substrate.

In some embodiments, a flow rate of the etch gas is manipulated to adjust an area of the substrate to be etched.

In some embodiments, method 500 further comprises providing a deposition gas (550) through the gas distribution device while the etch gas is provided. In some embodiments, method 500 comprises providing a deposition gas (550) through the gas distribution device before the etch gas is provided. In some embodiments, method 500 comprises providing an inert gas (560) through the gas distribution device. In some embodiments, the steps of providing deposition gas (550) and providing inert gas (560) overlap with steps 530-540.

Exemplary deposition gases include one or more carbon containing precursors. In some embodiments, the deposition gas includes a precursor having the formula $C_xH_yO_z$, where x is a natural number ranging from 2 to 10, y is a natural number ranging from 2 to 30, and z is a natural number ranging from 0 to 5. Exemplary inert gases include noble gases (e.g. Ar, He, Xe, Kr).

Figure 6A:
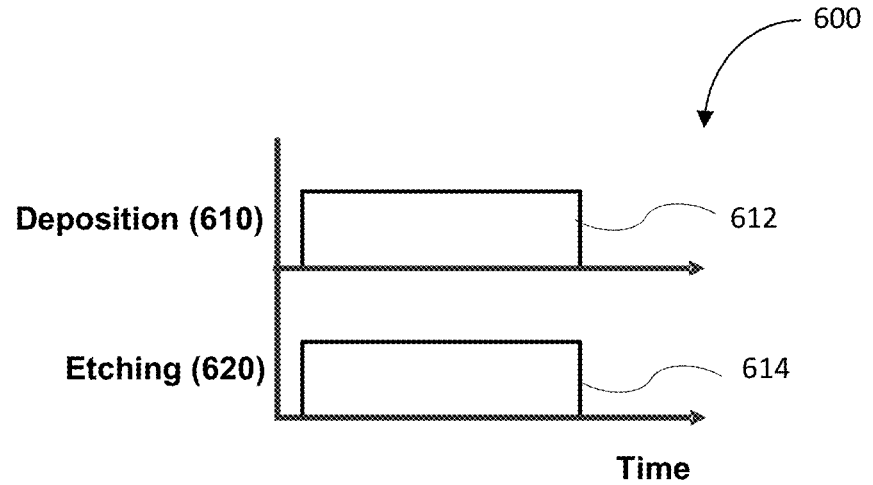
FIGS. 6A and 6B illustrate process sequences in accordance with at least one embodiment of the disclosure.
Figure 6B:
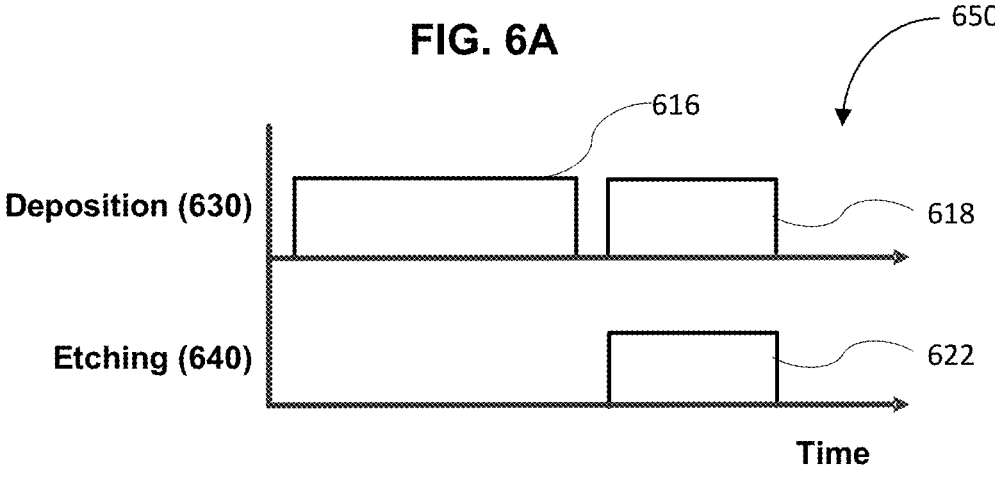

FIGS. 6A and 6B illustrate exemplary process sequences 600 of and 650 according to embodiments of the disclosure. FIG. 6A illustrates a process sequence 600 in which film deposition (610) and film etching (620) are performed simultaneously. In some embodiments, deposition gas 612 comprises carbon. In some embodiments, deposition gas 612 comprises helium. In some embodiments, etch gas 614 comprises $H_2$. In some embodiments, etch gas 614 comprises helium. Process sequence step 610 can be the same or similar to method steps 560 and/or 570; and process sequence step 620 can be the same or similar to method step 530.

FIG. 6B illustrates a process sequence 650 in which film etching (640) is performed after film deposition (630) (post-etching). In some embodiments, deposition gas 616 comprises carbon. In some embodiments, deposition gas 616 comprises helium. In some embodiments, when deposition gas 616 is turned off, inert gas 618 and etch gas 622 are turned on. In some embodiments, inert gas comprises helium. In some embodiments, etch gas 622 comprises $H_2$. In some embodiments, etch gas 622 comprises helium. Process sequence step 630 can be the same or similar to method steps 550 and/or 560; and process sequence step 640 can be the same or similar to method step 530.

The example embodiments of the disclosure described above do not limit the scope of the invention since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of selectively removing a film at the perimeter of a substrate, the method comprising:

providing a substrate processing apparatus comprising:

a susceptor within a reaction chamber;

a gas distribution device disposed above the susceptor; and a flow control ring above the susceptor and below the gas distribution device;

providing the substrate on the susceptor, wherein a bottom surface of the substrate is below a top surface of the susceptor;

providing a process gas through the distribution device;

providing an etch gas through an etch gas channel formed within the susceptor, the etch gas channel extending from below the bottom surface of the substrate to the top surface of the susceptor and about a perimeter of the substrate that is below the top surface of the susceptor; and forming a plasma within the reaction chamber using the etch gas, the gas distribution device and the susceptor.

2. The method of claim 1, wherein the gas distribution device forms an electrode.

3. The method of claim 1, wherein the gas distribution device and the susceptor are configured to form the plasma at the perimeter of the substrate and below the top surface of the susceptor.

4. The method of claim 1, wherein the etch gas does not remove the film at the center of the substrate.

5. The method of claim 1, wherein the susceptor comprises a susceptor stage, and wherein the etch gas channel is configured to provide the etch gas from below the bottom surface of the substrate toward a top surface of the susceptor and about the perimeter of the substrate stage.

6. The method of claim 1, wherein the plasma is formed between an inner surface of the flow control ring and the perimeter of the susceptor that is below the flow control ring.

7. The method of claim 1, further comprising modifying a flow rate of the etch gas.

8. The method of claim 1, wherein the etch gas comprises at least one of $H_2$, $O_2$, $CO_2$, $NO_2$, $NH_3$, He, Ar, $N_2$, and CO.

9. The method of claim 1, wherein the etch gas comprises $H_2$, and one of Ar and He.

10. The method of claim 1, wherein the susceptor comprises an electrostatic chuck.

11. The method of claim 1, wherein the process gas comprises a deposition gas, the method further comprising providing the deposition gas through the gas distribution device while the etch gas is provided.

12. The method of claim 1, wherein the process gas comprises a deposition gas, the method further comprising providing the deposition gas through the gas distribution device before the etch gas is provided.

13. The method of claim 8, further comprising providing an inert gas through the gas distribution device while the etch gas is provided.

14. The method of claim 1, wherein the step of forming the plasma comprises providing power from a power source coupled to the gas distribution device.

* * * * *